United States Patent [19]

Amazawa et al.

[11] 4,178,552
[45] Dec. 11, 1979

[54] NOISE ELIMINATING CIRCUIT

[75] Inventors: Kiyoshi Amazawa; Masaharu Mori, both of Toda, Japan

[73] Assignee: Clarion Co., Ltd., Tokyo, Japan

[21] Appl. No.: 864,549

[22] Filed: Dec. 27, 1977

[30] Foreign Application Priority Data

Dec. 28, 1976 [JP] Japan .............................. 51-158405
Dec. 28, 1976 [JP] Japan .............................. 51-158406

[51] Int. Cl.$^2$ ............................................. H04B 1/10
[52] U.S. Cl. .................................... 325/479; 325/402
[58] Field of Search ............... 325/348, 402, 404, 405, 325/408, 411, 417, 456, 473–476, 478–480, 482, 488; 328/165; 331/36 C, 117 R, 167, 175, 177 V

[56] References Cited

U.S. PATENT DOCUMENTS

| | | | |
|---|---|---|---|
| 3,460,056 | 8/1969 | Berger | 331/167 |
| 3,699,457 | 10/1972 | Wright | 325/479 |
| 3,725,674 | 4/1973 | Schaeffer et al. | 325/479 |

*Primary Examiner*—Robert L. Griffin
*Assistant Examiner*—Jin F. Ng

*Attorney, Agent, or Firm*—Wallenstein, Spangenberg, Hattis & Strampel

[57] ABSTRACT

A noise eliminating circuit for an AM receiver wherein noise pulse component included in an amplitude modulated wave are eliminated by making the RF or IF stage of the receiver an open circuit during such noise, while at the same time, compensating for the carrier components of the incoming signal that have lacked during such switching. The circuit comprises:

(i) a noise detector for detecting the noise components and responsive thereto for generating a trigger output signal;

(ii) a switch responsive to the trigger signal of the noise detector for making said RF or IF stage an open circuit;

(iii) a signal generating circuit connected through the switch to the RF or IF stage; and (iv) a phase detector for controlling the oscillator frequency generated by the signal generating circuit so that it is coincident with that of the carrier of the incoming signal at the time just before the switch opens.

5 Claims, 2 Drawing Figures

NOISE ELIMINATING CIRCUIT

BACKGROUND OF THE INVENTION

This invention relates to a noise eliminating circuit for an AM receiver that eliminates noise pulse components contained in an amplitude modulated wave, and more particularly, it relates to a noise eliminating circuit which opens the path of an RF stage or IF stage at the incoming of a noise pulse to thereby eliminate such noise, while at the same time, compensating for the carrier component of the incoming signal that is absent in the RF or IF stage output during switching by producing an oscillation frequency which is the same as the carrier frequency immediately before the switching.

If a noise pulse component contained in an amplitude modulated wave is eliminated, for example, by switching to open the path of an IF stage, during the period when such noise component exists, the IF signal is zero during this period, and so, the carrier component of the IF signal must be compensated as long as the IF stage is open. Therefore, in the conventional noise eliminating circuit of this type, an oscillator circuit has been used which is oscillated during the switching period to produce a fixed frequency for compensating for the absence of the carrier component.

However, in such a conventional of noise eliminating circuit, the oscillation frequency is fixed, and so, if the IF signal frequency differs from the oscillation frequency, a frequency difference appears at the termination of the switching period so as to generate another noise.

According to the conventional technique, when an audio signal exists and if the main signal path is switched to open to eliminate a noise pulse component as described, the cessation of the audio signals frequently causes a reversing phenomenon, a phenomenon where the noise sounds louder than before switching. No reversing phenomenon occurs if a relatively large noise pulse component is contained in the audio signal, but if the noise component is relatively small, a great distortion is developed in the audio signal after switching to eliminate the noise. It is therefore desired to effect said noise-eliminating switching only for eliminating a noise of such a high level that it causes no reversing phenomenon. However, in the case where an audio signal exists, a relatively small noise component is not a serious matter to worry about as long as the reversing phenomenon can be avoided, but if no audio signal exists, even such a relatively small noise component sounds too distinctively to be disregarded because it is not masked by the audio signal. As a consequence, it is difficult to prevent the phenomenon to a satisfactory extent.

It is therefore one object of this invention to provide a noise eliminating circuit that eliminates a noise pulse component by switching to open an RF or IF stage, and prevents generation of another noise by compensating for the frequency of the carrier of the incoming signal that has been absent during the switching period with a frequency so controlled as to be equal to said carrier frequency.

It is another object of this invention to provide a noise detecting circuit which detects, when an audio signal exists, only a noise pulse noise of a high level that causes no reversing phenomenon, and when no audio signal exists, detects even a noise of an relatively low level, so as to generate a pulsed signal that is capable of triggering a switching circuit for eliminating the noise component.

PREFERRED EMBODIMENT OF THE INVENTION

Figure 1:
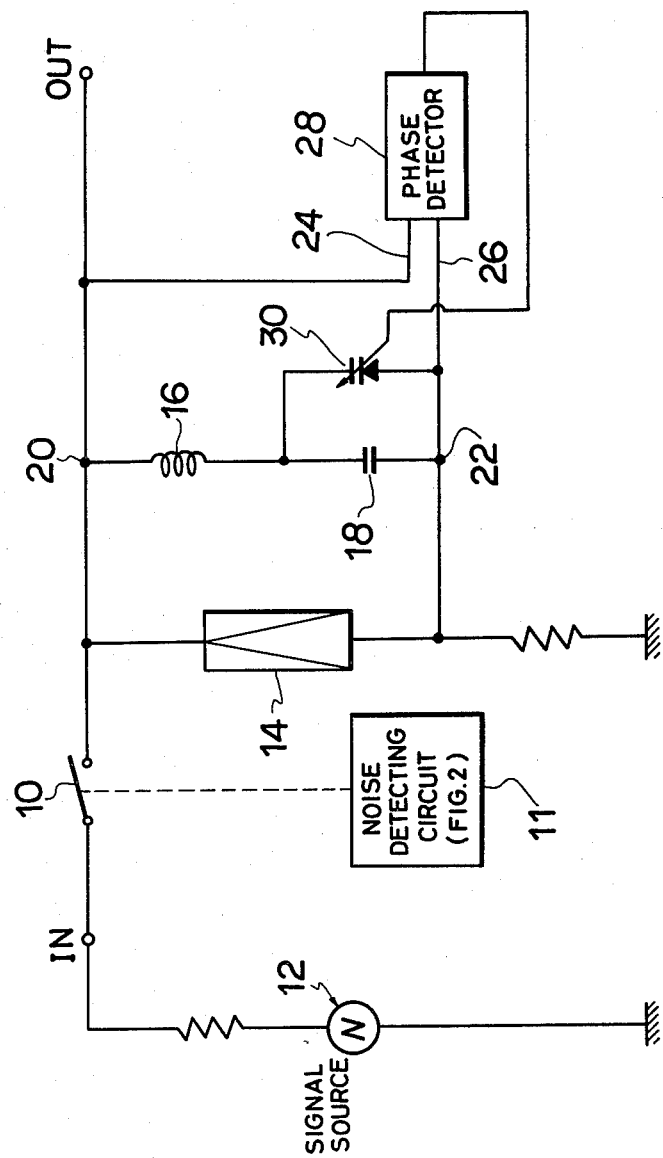
FIG. 1 shows circuit diagram of the embodiment of this invention.

FIG. 1 shows a specific arrangement of the noise eliminating circuit according to this invention. A switch 10 connected in series with the RF or IF signal system 12 of an AM receiver is a normally closed switch which opens is response to a trigger signal generated by a noise detecting circuit 11 when it detects incoming of a noise pulse; the switch includes, for example, a semiconductor switch such as a transistor. An LC series resonant amplifier circuit comprising an amplifier 14, a coil 16 and a capacitor 18 is connected to the IF switch 10 in parallel with the signal system 12. Both terminals 20 and 22 of the LC series resonant circuit are respectively connected to the first and second inputs 24 and 26, respectively of a phase detector 28. The output of the phase detector 28 is connected to the gate electrode of a variable capacity diode (varicap) 30 connected in parallel to the capacitor 18.

According to the arrangement described above of a noise eliminating circuit, the switch 10 opens in response to the incoming noise pulses, while at the same time, the load impedance increases to start oscillation of the LC series resonant circuit including the inductance L of the coil 16 and the composite capacity $C_R$, a combination of the capacity C of the capacitor 18 and the capacity $C_V$ of the variable capacity diode 30. The oscillation signal generated is continuously applied to the output terminal OUT while the switch 10 remains open, and compensates for the carrier component of the incoming signal that will be absent during the switching period.

Suppose that the oscillation frequency to be determined by the inductance L and the composite capacity $C_R$ is set at a level equal to the frequency of the inputted carrier; the switch 10 is opened and at the same time, the LC series resonance circuit is oscillated, but since the voltage across the junctions 20 and 22 is then substantially zero the phase detector 28 provides no output, and there is no change in the composite capacity $C_R$, and accordingly, the oscillation frequency that is equal to the frequency of the input carrier is provided to the output terminal OUT.

If a carrier having a higher frequency than in the above case is inputted and the switch 10 is opened, the voltage across and the current flowing at the junctions 22 and 20 has a given phase Which is detected by the phase detector 28 which supplies an output signal of a given polarity to the gate electrode of the variable capacity diode 30 and controls the composite capacity $C_R$ so as to provide an increased oscillation frequency. As a result, an oscillation frequency equal to the high frequency of the input carrier is applied to the output terminal OUT.

In contrast, if a carrier of a lower frequency is inputted and the switch 10 is then opened, the voltage across and the current flowing at the junctions 22 and 20 has an opposite phase which is detected by, the phase detector 28 which provides the gate electrode of the variable capacity diode 30 with an output signal whose polarity is opposite to said given polarity and controls the composite capacity $C_R$ so as to provide a decreased oscillation frequency. As a result, frequency equal to the low frequency of the input carrier is applied to the output terminal OUT.

Therefore, according to the above described arrangement that is capable of controlling an oscillation frequency to be equal to the frequency of an inputted carrier throughout the period when a noise pulse exists, the generation of a noise that has been encountered in the conventional noise eliminating circuit due to the frequency difference between the input carrier frequency and the oscillation frequency can be prevented, thus achieving an improved effect of noise elimination.

Figure 2:
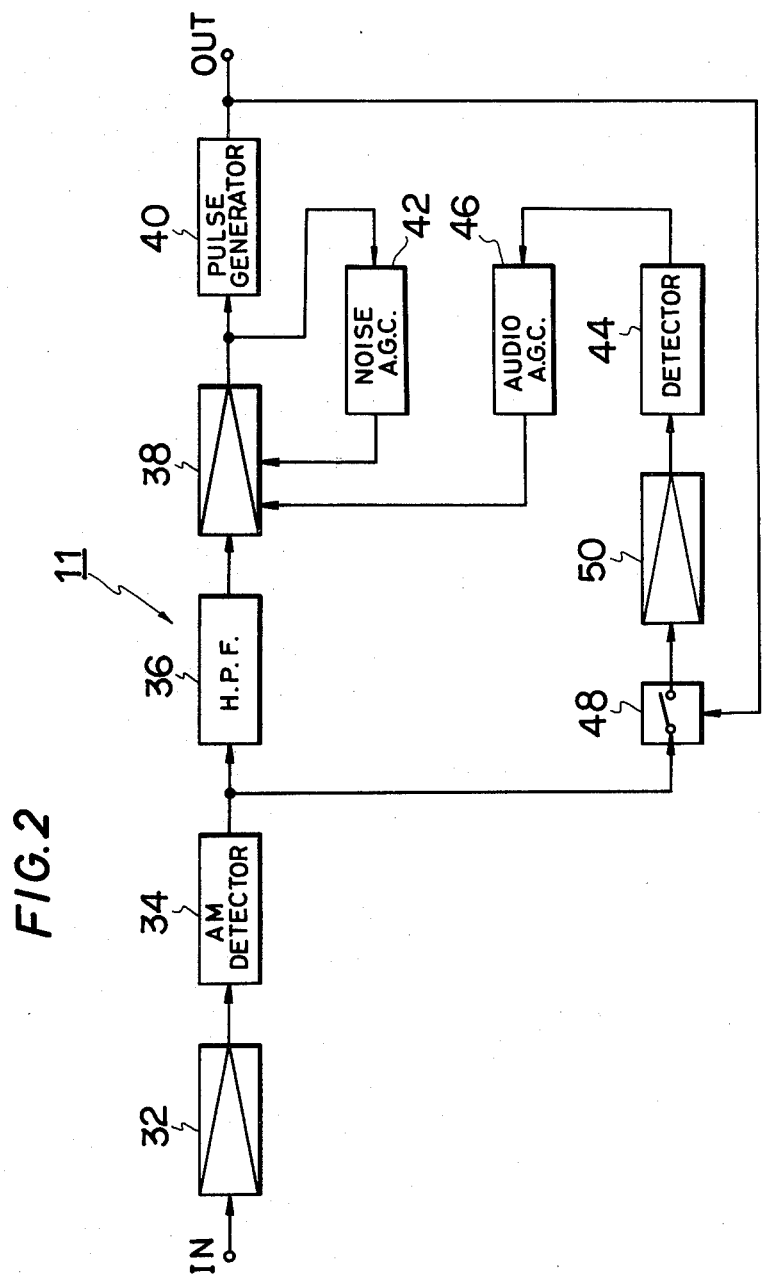
FIG. 2 shows more detailed circuit diagram of a portion of FIG. 1.

FIG. 2 is a block diagram showing a specific arrangement of the noise detecting circuit 11. An incoming signal of an amplitude modulated wave obtained from the RF stage or IF stage of an AM receiver is amplified by an amplifier 32 and detected by an AM detecting circuit 34. The output of the detector circuit 34 is connected to the input of a noise amplifier 38 through a high-pass filter (H.P.F.) 36 that extracts a noise which is generally a high frequency component. The output of the noise amplifier 38 is connected to the input of a pulse generator circuit, such as a Schmitt trigger circuit 40. The output of the noise amplifier 38 is also connected to a noise automatic gain control (AGC) circuit 42 for effecting noise AGC. The output of the detector circuit 34 is also connected through a switch 48 to the input of an audio amplifier 50. The switch 48 is a normally closed switch that is made open in response to a pulse signal that is outputted from the Schmitt trigger circuit 40; it includes, for example a semiconductor switch, such as a transistor. The output of the audio amplifier 50 is connected through detector circuit 44 to an audio AGC circuit for effecting audio AGC.

According to the noise detecting circuit arrangement described above, AGC signals, i.e. noise AGC and audio AGC, control signals are applied to the noise amplifier 38. The noise AGC signal is applied so that only with continuous inputting of a relatively large noise component will the amplifier 38 produce a signal of sufficient magnitude to trigger the Schmitt trigger circuit 40 to generate an RF or IF stage opening pulse. The audio AGC signal is applied in order to decrease the gain of the noise amplifier 38 and prevents the amplifier 38 producing a Schmitt trigger operating signal which would open the RF or IF stage and produce a reversing phenomenon when an appreciable audio signal exists. In other words, the level of signal noise outputed from the noise amplifier 38 is controlled by the noise AGC and audio AGC, signals and the operation level of the Schmitt trigger circuit 40 is so set that the Schmitt trigger circuit 40 generates a pulse only when the input signal noise level exceeds a predetermined level, or even when the input noise signal lever is low in the absence of an audio signal where no reversing phenomenon is caused to occurs.

Therefore, if an audio input signal containing a pulsed noise component enters this circuit, the noise component is extracted through the H.P.F. 36 and subjected to the noise AGC and audio AGC control operations described so as to output a noise component of a certain level from the noise amplifier 38. If the level of the input noise signal is so low as to cause a reversing phenomenon in the presence of an audio signal, the Schmitt trigger circuit 40 does not actuate to generate a pulse. If, on the other hand, the level of the input noise signal is too large to cause a reversing phenomenon, with or without an audio signal, the Schmitt trigger circuit 40 generates a pulse signal that triggers switch 10 (FIG. 1) provided on the main signal path for eliminating the noise component. A Schmitt trigger generated pulse is then applied to the switch 48 to open it, which stops the function of the audio AGC by blocking subsequent audio signals.

On the other hand, if no audio signal exists and only a noise pulse noise component enters the circuit, a low noise signal level is more greatly amplified by the noise amplifier 38, and it causes the Schmitt trigger circuit 40 to generate a pulse for triggering the switch 10 as mentioned above. At the same time, the latter pulse is applied to the switch 48 to open it. This is in order that subsequent incoming of a relatively large noise pulse signal may not actuate the function of audio AGC to lower the gain of the noise amplifier 38.

According to the arrangement described above, prevention of a reversing phenomenon as well as a noise detection at high sensitivity can be realized because, if an audio signal exists, it detects only a noise pulse signal of such a level that no reversing phenomenon is caused, and if no audio signal exists, it can even detect a noise signal of an extremely low level.

What is claimed is:

1. A noise eliminating circuit for an AM receiver including RF and IF stages and wherein a pulsed noise component included in an amplitude modulated wave signal is eliminated by making the RF or IF stage of the receiver an open circuit, while at the same time, compensating for the carrier components of the incoming signal that are blocked during the open circuit condition of the stage, said circuit comprising:
   (i) noise detecting means for detecting said noise component and responsive thereto for generating a control signal;
   (ii) switch means responsive to said control signal of said noise detecting means for blocking passage of the amplitude modulated wave signal through said stage; and
   (iii) signal producing means responsive to the carrier component of said amplitude modulated wave signal passing through said stage just before the signal is blocked for duplicating said carrier component during such signal blockage.

2. A noise eliminating circuit according to claim 1 wherein said signal producing means includes signal generating means adapted to generate a signal of a given frequency at the same time as said switch means opens, and phase detecting means adapted to detect a difference in signal phase across said signal generating means for controlling the frequency of an output of said signal generating means in response to said signal difference.

3. The noise eliminating circuit according to claim 2 wherein said signal generating means comprises an LC series resonant circuit including a variable capacitance device in which the capacitance is controlled by an output of the phase detecting means.

4. The noise eliminating circuit according to claim 1 wherein said noise detecting means comprises:
   (i) an AM detecting circuit for detecting an audio signal from said incoming signal;
   (ii) a noise extracting means for extracting a noise pulse on the detected audio signal;

(iii) amplifier means for controlling the level of the extracted noise in accordance with the detected audio signal; and
(iv) means responsive to the extracted noise of a predetermined level for providing said control signal.

5. The noise eliminating circuit according to claim 4 wherein said control signal providing means includes an amplifier having its gain which is variable in response to the audio signal and the noise, respectively.

* * * * *